(12) United States Patent
Chiang

(10) Patent No.: US 12,230,324 B2
(45) Date of Patent: Feb. 18, 2025

(54) MASKING CIRCUIT AND PRE-CHARGE CIRCUIT APPLICABLE TO CONTENT ADDRESSABLE MEMORY

(71) Applicant: REALTEK SEMICONDUCTOR CORPORATION, Hsinchu (TW)

(72) Inventor: I-Hao Chiang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 375 days.

(21) Appl. No.: 17/564,251

(22) Filed: Dec. 29, 2021

(65) Prior Publication Data

US 2022/0293179 A1 Sep. 15, 2022

(30) Foreign Application Priority Data

Mar. 15, 2021 (TW) ................. 110109138

(51) Int. Cl.
| | |
|---|---|
| G11C 15/00 | (2006.01) |
| G11C 11/408 | (2006.01) |
| G11C 11/417 | (2006.01) |
| G11C 11/419 | (2006.01) |
| G11C 15/04 | (2006.01) |
| H03K 19/20 | (2006.01) |

(52) U.S. Cl.
CPC .......... *G11C 15/04* (2013.01); *G11C 11/4085* (2013.01); *G11C 11/417* (2013.01); *G11C 11/419* (2013.01); *H03K 19/20* (2013.01)

(58) Field of Classification Search
CPC ... G11C 15/04; G11C 11/4085; G11C 11/417; G11C 11/419; H03K 19/02
USPC .......................................................... 365/49
See application file for complete search history.

(56) References Cited

U.S. PATENT DOCUMENTS

| | | | | |
|---|---|---|---|---|
| 6,760,241 B1 * | 7/2004 | Gharia | ................. | G11C 15/043 |
| | | | | 365/222 |
| 6,987,684 B1 | 1/2006 | Branth et al. | | |
| RE40,932 E | 10/2009 | Diede et al. | | |
| 8,913,412 B1 * | 12/2014 | Khanna | .................. | G11C 15/04 |
| | | | | 365/49.17 |

* cited by examiner

*Primary Examiner* — Tha-O H Bui
(74) *Attorney, Agent, or Firm* — WPAT, PC

(57) ABSTRACT

A masking circuit of a content addressable memory (CAM) includes a masking control circuit and a level control circuit. The masking control circuit generates a masking signal according to a word line (WL) signal and a write enablement (WE) signal. When both the WL and WE signals are at a first level, the masking signal is a first masking signal; when they are at different levels respectively, the masking signal is a second masking signal. The level control circuit generates a level control signal according to the masking signal for determining whether to pull a voltage level of a match line of the CAM to a predetermined level. When the masking signal is the first masking signal, the level control circuit pulls the voltage level to the predetermined level; and when the masking signal is the second masking signal, the level control circuit does not interfere in the voltage level.

17 Claims, 8 Drawing Sheets

MASKING CIRCUIT AND PRE-CHARGE CIRCUIT APPLICABLE TO CONTENT ADDRESSABLE MEMORY

BACKGROUND OF THE INVENTION

1. Field of the Invention

The present disclosure relates to a masking circuit and a pre-charge circuit, especially to a masking circuit and a pre-charge circuit applicable to a content addressable memory (CAM).

2. Description of Related Art

FIG. 1 shows a basic element 100 of a conventional content addressable memory (CAM). The basic element 100 includes a storage component 110 and a comparison component 120. The storage component 110 is configured to store storage data, and the comparison component 120 is configured to compare the storage data with input data and thereby output a comparison result to a match line that can be accessed by a back-end circuit. The storage data is stored through the control of a word line (WL) and a bit line (BL). The input data is provided through the control of a search bit line (SBL). As shown in FIG. 1, the bit line includes a positive-end bit line (BLP) and a negative-end bit line (BLN), and the search bit line includes a positive-end search bit line (SBLP) and a negative-end search bit line (SBLN).

FIG. 2 shows a basic configuration 200 of a conventional CAM array. The basic configuration includes multiple CAM cells 210, multiple pre-charge circuits 220, and a search data register/search bit line driver 230. An example of each CAM cell 210 is the basic element 100 of FIG. 1. Each row of the CAM cells 210 is equipped with a pre-charge circuit 220. Each pre-charge circuit 220 is configured to charge a match line of a row of the CAM cells 210 or discharges the charges of the match line according to a match line pre-charge signal (MLPR). The search data register/search bit line driver 230 controls the search bit line of each column of the CAM cells 210 to provide input data. When the basic configuration 200 operates, one of the pre-charge circuits 220 charges the match line of a row of the CAM cells 210 including a selected CAM cell 210 to make the voltage level of the selected CAM cell reach a high level (a logical high level such as a level having a logical value "1"). After the search data register/search bit line driver 230 provides the input data, the selected CAM cell 210 compares its storage data with the input data and thereby generates a comparison result. If the comparison result shows that the storage data is different from the input data, the pre-charge circuit 220 discharges the charges of the match line coupled to the selected CAM cell 210 to make its voltage level decrease to a low level (a logical low level such as a level having a logical value "0"). If the comparison result shows that the storage data is the same as the input data, the pre-charge circuit 220 leaves the match line coupled to the selected CAM cell 210 alone to let it stay at the high level. The coupling architecture of the CAM cells 210 in FIG. 2 is usually called a NOR type match line architecture. It is noted that each row of the CAM cells 210 in FIG. 2 is coupled to a word line driver (not shown) to receive a word line signal.

Please refer to FIGS. 1-2. In regard to a conventional CAM array, a storage component (e.g., the storage component 110 of FIG. 1) and a comparison component (e.g., the comparison component 120 of FIG. 1) of a CAM cell in the CAM array operate independently; normally, the reading operation and the comparison operation of the CAM array can be performed concurrently, but the writing operation of the CAM array will affect the comparison operation of the CAM cell. More specifically, when the CAM cell is performing the writing operation, the comparison result of the comparison operation with respect to the CAM cell could be wrong.

Generally, in order to prevent the wrong comparison result caused by the writing operation, the conventional CAM array includes a back-end complicated judgement circuit to tackle this problem, and this leads to the increase of the design and manufacturing cost.

SUMMARY OF THE INVENTION

An object of the present disclosure is to provide a masking circuit and a pre-charge circuit as improvements over the prior art.

An embodiment of the masking circuit of the present disclosure is applicable to a content addressable memory (CAM). The embodiment includes a masking control circuit and a level control circuit. The masking control circuit is configured to generate a masking signal according to a first signal and a second signal, wherein when both the first signal and the second signal are at a first level, the masking signal is a first masking signal, and when the first signal and the second signal are at different levels respectively, the masking signal is a second masking signal different from the first masking signal. The level control circuit is configured to generate a level control signal according to the masking signal and thereby determine whether to pull a voltage level of an output terminal to a predetermined level, wherein the output terminal is coupled to a match line of the CAM. When the masking signal is the first masking signal, the level control circuit pulls the voltage level of the output terminal to the predetermined level; and when the masking signal is the second masking signal, the level control circuit does not interfere in the voltage level of the output terminal.

An embodiment of the pre-charge circuit of the present disclosure is applicable to a CAM. The embodiment includes a masking control circuit, a charge control circuit, and a discharge control circuit. The masking control circuit is configured to generate a masking signal according to a word line (WL) signal and a write enablement (WE) signal, wherein when both the WL signal and the WE signal are at a first level, the masking signal is a first masking signal, and when the WL signal and the WE signal are at different levels respectively, the masking signal is a second masking signal different from the first masking signal. The charge control circuit is configured to generate a charge control signal according to a match line pre-charge signal and the masking signal and thereby determine whether to charge a match line, wherein when the masking signal is the first masking signal, the masking signal masks the variation of the match line pre-charge signal to allow the charge control signal to be free from the variation of the match line pre-charge signal, and when the masking signal is the second masking signal, the masking signal does not mask the variation of the match line pre-charge signal to let the charge control signal vary with the variation of the match line pre-charge signal. The discharge control circuit is configured to generate a discharge control signal according to the masking signal and thereby determine whether to discharge the charges of the match line, wherein when the masking signal masks the variation of the match line pre-charge signal, the discharge control signal is used for discharging the charges of the match line.

Another embodiment of the pre-charge circuit of the present disclosure is also applicable to a CAM, and includes a masking control circuit, a charge control circuit, and a discharge control circuit. The masking control circuit is configured to couple a charge terminal with the charge control circuit or decouple the charge terminal from the charge control circuit according to a word line (WL) signal and a write enablement (WE) signal, wherein when any of the WL signal and the WE signal is at a first level, the masking control circuit couples the charge terminal with the charge control circuit, and when both the WL signal and the WE signal are not at the first level, the masking control circuit decouples the charge terminal from the charge control circuit. The charge control circuit is configured to determine whether to charge a match line according to a match line pre-charge signal, wherein when the match line pre-charge signal is at a second level, the charge control circuit determines to charge the match line, and when the match line pre-charge signal is at the first level, the charge control circuit determines not to charge the match line. The discharge control circuit is configured to determine whether to discharge the charges of the match line according to the WL signal and the WE signal, wherein when both the WL signal and the WE signal are at the second level, the discharge control circuit determines to discharge the charges of the match line, and when any of the WL signal and the WE signal is not at the second level, the discharge control circuit determines not to discharge the charges of the match line.

These and other objectives of the present invention will no doubt become obvious to those of ordinary skill in the art after reading the following detailed description of the preferred embodiments that are illustrated in the various figures and drawings.

DETAILED DESCRIPTION OF THE PREFERRED EMBODIMENTS

The present specification discloses a pre-charge circuit and a masking circuit that are capable of determining whether to mask a comparison result of a basic element of a content addressable memory (CAM) and thereby fulfill the purpose of reducing the complexity of CAM circuit design. The pre-charge circuit and the masking circuit of the present disclosure are applicable to a CAM having an NOR type match line architecture; for instance, the pre-charge circuit of the present disclosure can replace each of the pre-charge circuits 220 of FIG. 2, and can receive a word line (WL) signal and a write enablement (WE) signal to operate accordingly in comparison with the pre-charge circuit 220. In addition, the pre-charge circuit of the present disclosure can receive a system clock generated by a timing controller and operate accordingly. The generation and control of the WL signal, the WE signal, and the system clock can be realized with known/self-developed techniques which fall without the scope of the present disclosure, and their details are omitted here.

Figure 3:
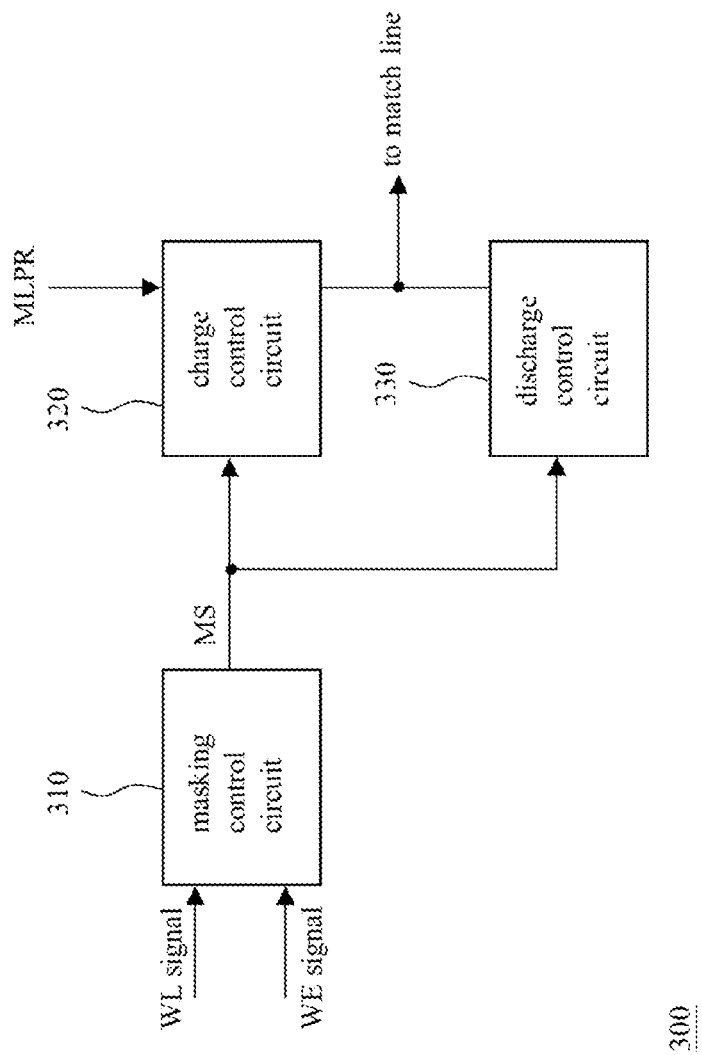
FIG. 3 shows an embodiment of the pre-charge circuit of the present disclosure.

FIG. 3 shows an embodiment of the pre-charge circuit of the present disclosure. The pre-charge circuit 300 of FIG. 3 includes a masking control circuit 310, a charge control circuit 320, and a discharge control circuit 330. These circuits are described in the following paragraphs respectively.

Please refer to FIG. 3. The masking control circuit 310 is configured to generate a masking signal MS according to a WL signal and a WE signal. When both the WL signal and the WE signal are at a first level (e.g., a logical high level such as a level having a logical value "1"), the masking signal MS is a first masking signal. When the WL signal and the WE signal are at different levels respectively, the masking signal MS is a second masking signal that is different from the first masking signal. For instance, when both the WL signal and the WE signal are at a second level (e.g., a logical low level such as a level having a logical value "0"), the masking signal MS is the second masking signal. It is noted that in this specification the description "a signal at a level" can be interpreted as "the level of a signal falling within a predetermined range".

Please refer to FIG. 3. The charge control circuit 320 is configured to generate a charge control signal (e.g., the charge control signal CG of FIG. 4) according to a match line pre-charge signal MLPR and the masking signal MS and thereby determine whether to charge a match line of a CAM. When the masking signal MS is the first masking signal, the masking signal MS masks the variation of the match line pre-charge signal MLPR to allow the charge control signal to be free from the variation of the match line pre-charge signal MLPR; in other words, the charge control signal cannot perceive the variation of the match line pre-charge signal MLPR. When the masking signal MS is the second masking signal, the masking signal MS does not mask the variation of the match line pre-charge signal MLPR to let the charge control signal vary with the variation of the match line pre-charge signal MLPR.

Please refer to FIG. 3. The discharge control circuit 330 is configured to generate a discharge control signal (e.g., the discharge control signal DCG of FIG. 4) and thereby determine whether to discharge the charges of the match line of the CAM. When the masking signal MS masks the variation of the match line pre-charge signal MLPR, the discharge control signal is used for discharging the charges of the match line.

Figure 4:
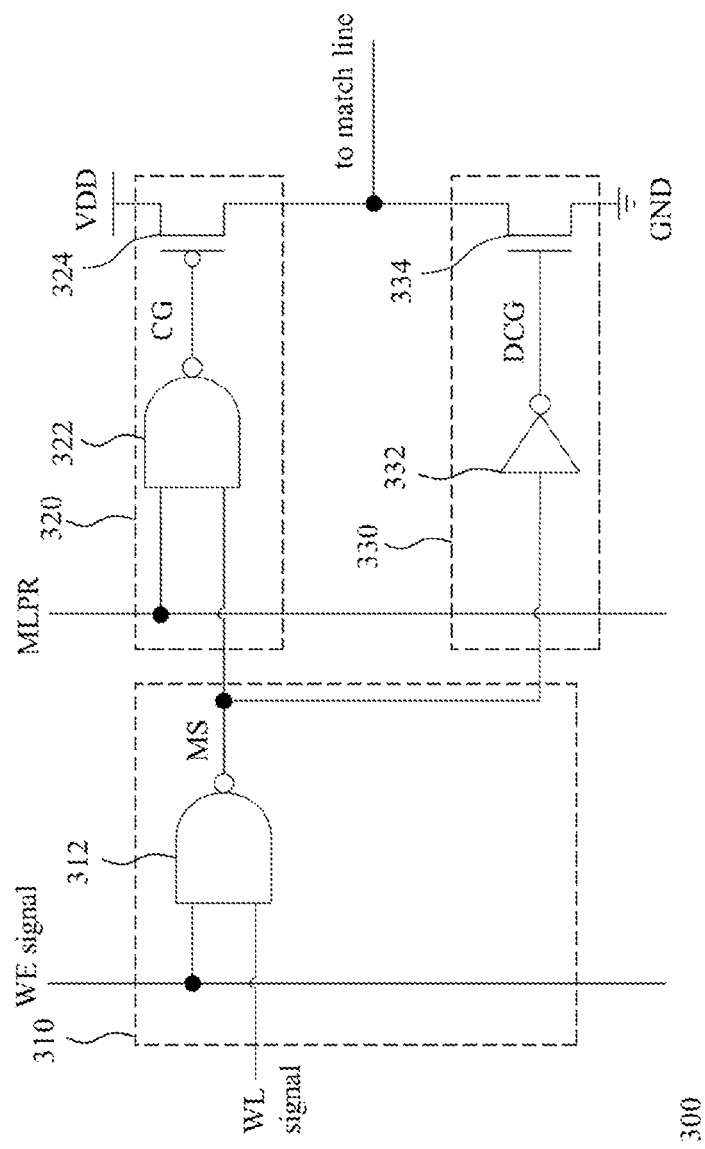
FIG. 4 shows an embodiment of the masking circuit, the charge control circuit, and the discharge control circuit of FIG. 3.

FIG. 4 shows an embodiment of the masking control circuit 310, the charge control circuit 320, and the discharge control circuit 330. The masking control circuit 310 includes a first NAND gate 312 that is configured to generate the masking signal MS according to the WL signal and the WE signal. The charge control circuit 320 includes a second NAND gate 322 that is configured to generate a charge control signal CG according to the match line pre-charge signal MLPR and the masking signal MS. The charge control circuit 320 further includes a first switch 324 (e.g., a PMOS transistor) that is configured to couple a charge terminal (e.g., a power supply terminal VDD) with the match line or decouple the charge terminal from the match line according to the charge control signal CG. The discharge control circuit 330 includes an inverter 322 that is configured to generate a discharge control signal DCG according to the masking signal MS. The discharge control circuit 330 further includes a second switch 334 (e.g., an NMOS transistor) that is configured to couple the match line with a discharge terminal (e.g., a grounding terminal GND) or decouple the match line from the discharge terminal according to the discharge control signal DCG.

It is noted that the combination of the first NAND gate 312, the second NAND gate 322, and the inverter 332 of FIG. 4 can be replaced with another combination of logic gates, which means that the present invention is not limited to the embodiment of FIG. 4. Since people having ordinary skill in the art can appreciate how to fulfill the above-mentioned replacement in accordance with the present disclosure and the common knowledge of this technical field, redundant description is omitted here.

It is also noted that the charge control circuit 320 of FIG. 3 can optionally be omitted according to the demand for implementation. Providing the charge control circuit 320 is omitted, the circuit of FIG. 3 functions as a masking circuit including the masking control circuit 310 and the discharge control circuit 330; in this case, the masking circuit can disregard whether the aforementioned match line is charged. More specifically, when the masking circuit discharges the charges of the match line, even though the match line is charged according to the aforementioned match line pre-charge signal MLPR at the same time, the discharge path between the charge terminal and the discharge terminal will not substantially influence the operation of the masking circuit. In order to prevent the masking circuit from being influenced by the discharge path, people having ordinary skill in the art can use any known/self-developed manner to prevent the match line from being pre-charged and discharged concurrently. For example, a timing control manner can be exerted on the WE signal and/or the match line pre-charge signal MLPR to achieve the following effects: during the phase of writing data into the CAM, when the masking signal MS is the first masking signal (i.e., the WE signal is at the first level) to discharge the charges of the match line, the match line pre-charge signal MLPR is at the second level so that the match line won't be pre-charged. The WL signal and the WE signal can be replaced with other kinds of signals as long as such replacement is practicable; the discharge control circuit 330 can be replaced with a level control circuit (e.g., a circuit equivalent to the discharge control circuit 330) while the discharge terminal can be replaced with a predetermined-level terminal whose voltage level is predetermined.

Figure 5:
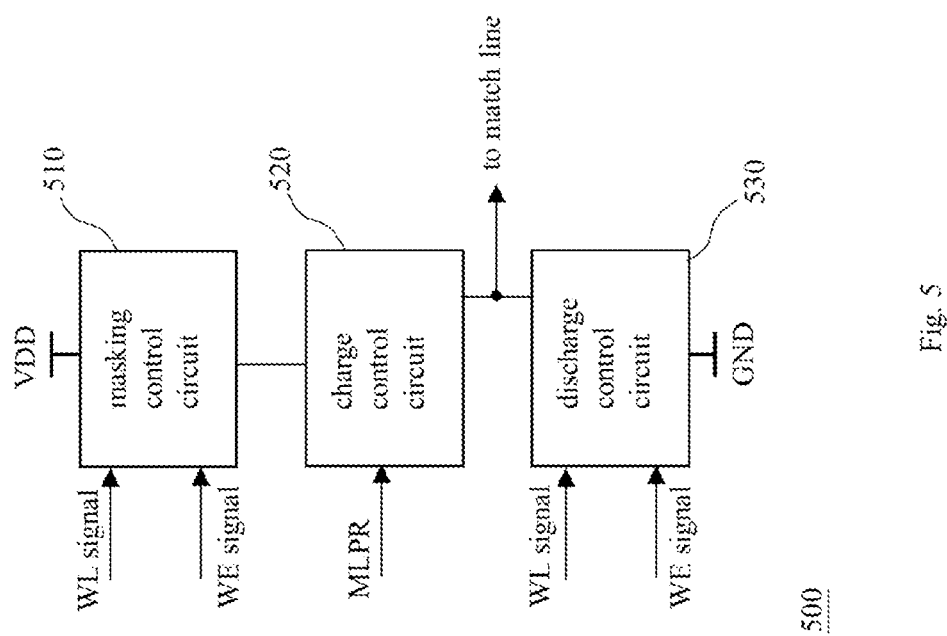
FIG. 5 shows another embodiment of the pre-charge circuit of the present disclosure.

FIG. 5 shows another embodiment of the pre-charge circuit of the present disclosure. The pre-charge circuit 500 of FIG. 5 includes a masking control circuit 510, a charge control circuit 520, and a discharge control circuit 530. These circuits are described in the following paragraphs respectively.

Please refer to FIG. 5. The masking control circuit 510 is configured to couple a charge terminal (e.g., a power supply terminal VDD) with the charge control circuit 520 or decouple the charge terminal from the charge control circuit 520 according to a WL signal and a WE signal. When any of the WL signal and the WE signal is at a first level (e.g., a logical low level such as a level having a logical value "0"), the masking control circuit 510 couples the charge terminal with the charge control circuit 520. When both the WL signal and the WE signal are not at the first level, the masking control circuit 510 decouples the charge terminal from the charge control circuit 520. For example, when both the WL signal and the WE signal are at a second level (e.g., a logical high level such as a level having a logical value "1"), the masking control circuit 510 decouples the charge terminal from the charge control circuit 520.

Please refer to FIG. 5. The charge control circuit 520 is configured to determine whether to charge a match line (ML) of a CAM according to a match line pre-charge signal MLPR. When the match line pre-charge signal MLPR is at the second level (e.g., a logical high level), the charge control circuit 520 determines to charge the match line. When the match line pre-charge signal MLPR is at the first level (e.g., a logical low level), the charge control circuit 520 determines not to charge the math line.

Please refer to FIG. 5. The discharge control circuit 530 is configured to determine whether to discharge the charges of the match line to a discharge terminal (e.g., a grounding terminal GND) according to the WL signal and the WE signal. When both the WL signal and the WE signal are at the second level (e.g., a logical high level), the discharge control circuit 530 determines to discharge the charges of the match line. When any of the WL signal and the WE signal is not at the second level (e.g., when at least one of the WL signal and the WE signal is not at a logical high level), the discharge control circuit 530 determines not to discharge the charges of the match line. For example, when any of the WL signal and the WE signal is at the first level (e.g., a logical low level), the discharge control circuit 530 determines not to discharge the charges of the match line.

Figure 6:
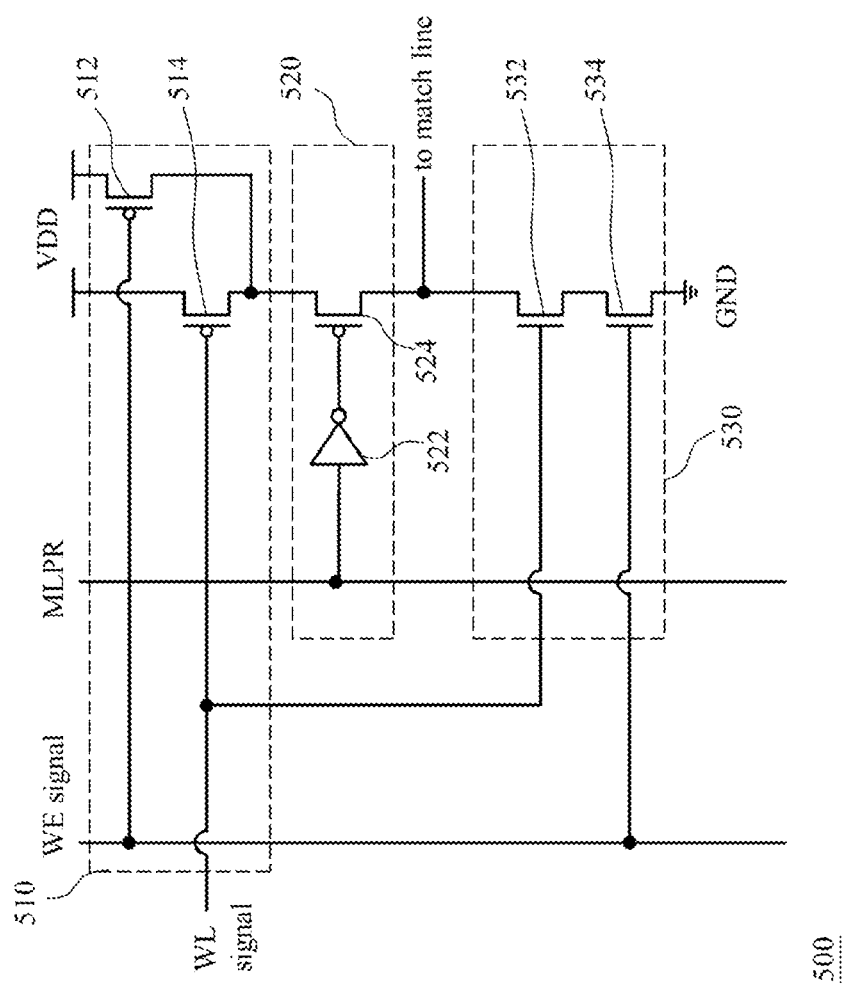
FIG. 6 shows an embodiment of the masking circuit, the charge control circuit, and the discharge control circuit of FIG. 5.

FIG. 6 shows an embodiment of the masking control circuit 510, the charge control circuit 520, and the discharge control circuit 530 of FIG. 5. The masking control circuit 510 includes a first switch (e.g., a PMOS transistor) and a second switch 514 (e.g., a PMOS transistor). The first switch is coupled between a charge terminal VDD and the charge control circuit 520, and configured to couple the charge terminal VDD with the charge control circuit 520 or decouple the charge terminal VDD from the charge control circuit 520 according to the WE signal. The second switch is coupled between the charge terminal VDD and the charge control circuit 520, and configured to couple the charge terminal VDD with the charge control circuit 520 or decouple the charge terminal VDD from the charge control circuit 520 according to the WL signal.

Please refer to FIG. 6. The charge control circuit 520 includes an inverter 522 and a third switch 524 (e.g., a PMOS transistor). The inverter 522 is configured to generate an inverted match line pre-charge signal according to the match line pre-charge signal MLPR and thereby determine whether to charge the match line. The combination of the inverter 522 and the third switch 524 can be replaced with a single switch (e.g., an NMOS transistor), and the logic to control the single switch is opposite to the logic to control the third switch 524. The third switch 524 is configured to couple the masking control circuit 510 with the match line or decouple the masking control circuit 510 from the match line according to the inverted match line pre-charge signal.

Please refer to FIG. 6. The discharge control circuit 530 includes a fourth switch 532 (e.g., an NMOS transistor) and a fifth switch 534 (e.g., an NMOS transistor). The fourth switch 532 is coupled between the match line and the fifth switch 534, and configured to couple the match line with the fifth switch 534 or decouple the match line from the fifth switch 534 according to the WL signal. The fifth switch 534 is coupled between the fourth switch 532 and a discharge terminal GND, and configured to couple the fourth switch 542 with the discharge terminal GND or decouple the fourth switch 542 from the discharge terminal GND according to the WE signal. In an alternative embodiment, the fourth switch 532 is turned on/off according to the WE signal while the fifth switch 534 is turned on/off according to the WL signal.

It is noted that each of the aforementioned match lines of a CAM can be coupled to a back-end circuit (not shown) of the CAM through a sense amplifier (not shown). The sense amplifier is configured to sample the signal of the match line during a latch active period and thereby output a sample signal level as a match output to the back-end circuit. Since the setting and operation of the sense amplifier and back-end circuit can be realized with known/self-developed techniques which fall beyond the scope of the present disclosure, their details are omitted here.

Figure 7:
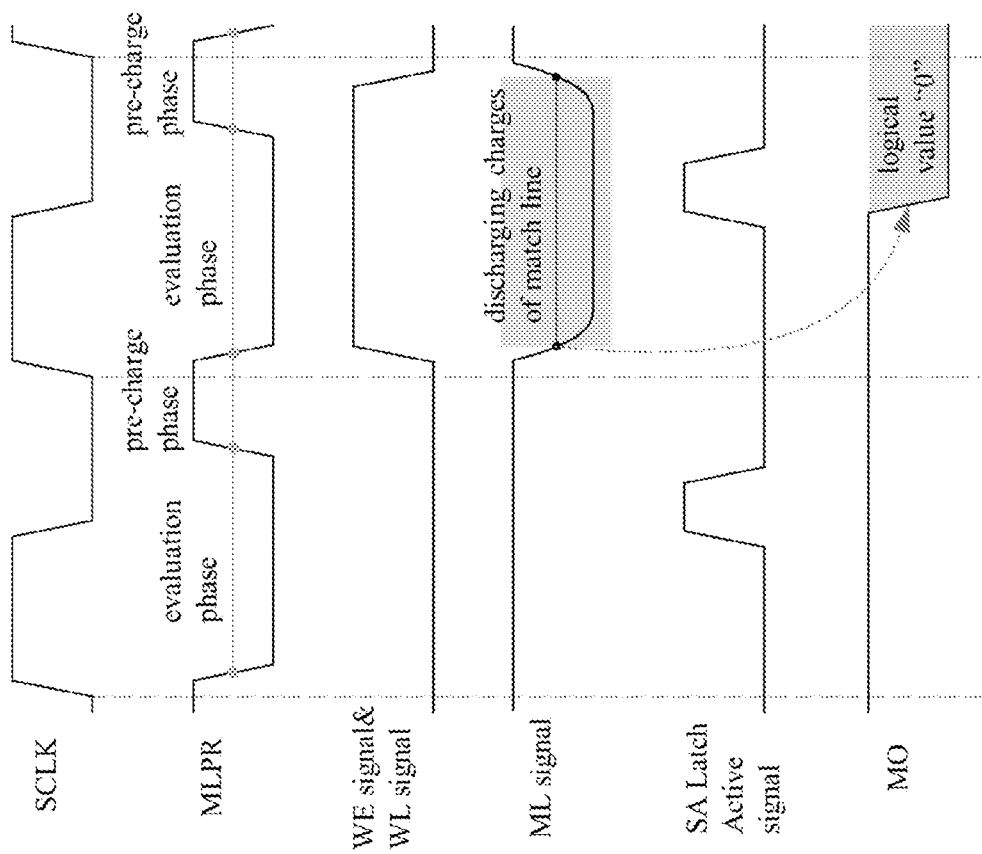
FIG. 7 shows a signal relation diagram in regard to the period of a writing operation of a CAM array.
Figure 8:
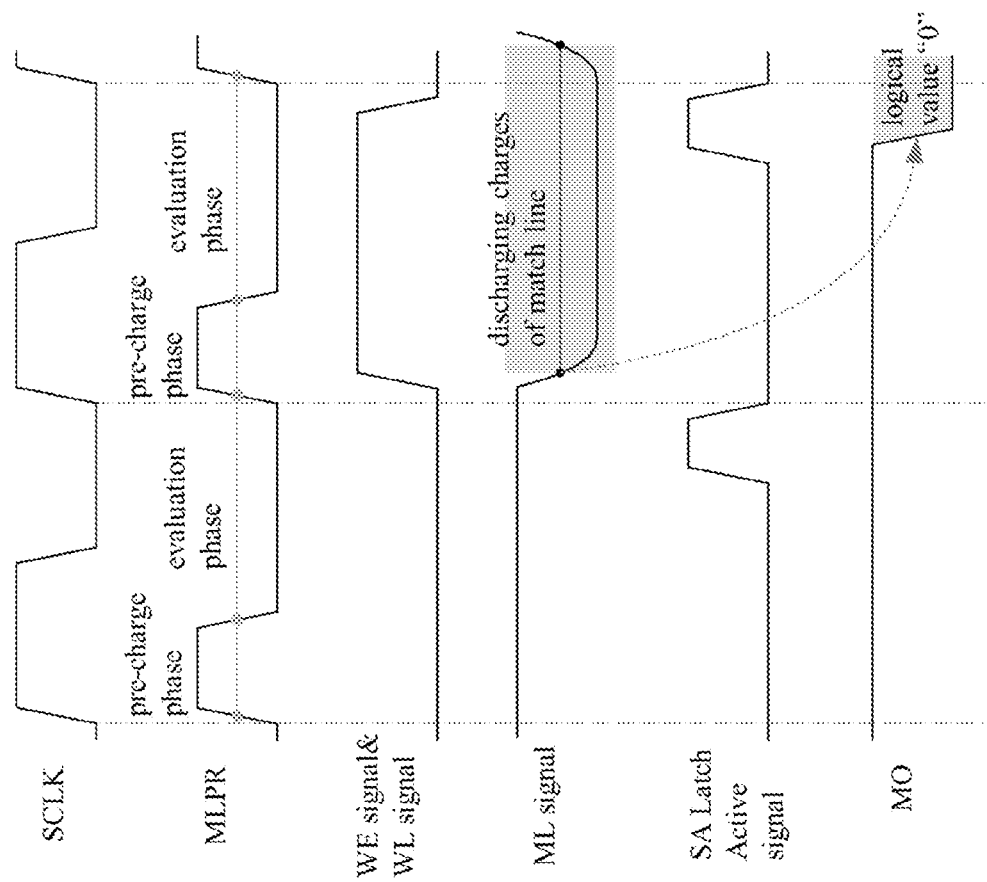
FIG. 8 shows another signal relation diagram in regard to the period of a writing operation of a CAM array.

FIG. 7 shows a signal relation diagram in regard to the period of a writing operation of a CAM array. The signals shown in FIG. 7 include a system clock SCLK for the CAM array, a match line pre-charge signal MLPR, a WL signal, a WE signal, a match line (ML) signal (i.e., the signal of a match line), a sense amplifier latch active (SA Latch Active) signal (i.e., the latch active signal of a sense amplifier), and a match output MO. As shown in FIG. 7, in each cycle of the system clock SCLK, the match line pre-charge signal MLPR enters an evaluation phase for comparison first, and then enters a pre-charge phase. When both the WL signal and the WE signal are at a high level, the aforementioned discharge control circuit 330/530, for example, discharges the charges of the match line to lower the level of the ML signal as illustrated with the marked region "discharging charges of match line" of the ML signal in FIG. 7, and thereby makes the level of the match output MO have a logical value "0" as illustrated with the marked region "logical value "0"" of the match output MO in FIG. 7. FIG. 8 shows another signal relation diagram in regard to the period of a writing operation of a CAM array. In comparison with FIG. 7, the match line pre-charge signal MLPR enters a pre-charge phase first and then enters an evaluation phase for comparison in each cycle of the system clock SCLK of FIG. 8.

Figure 1:
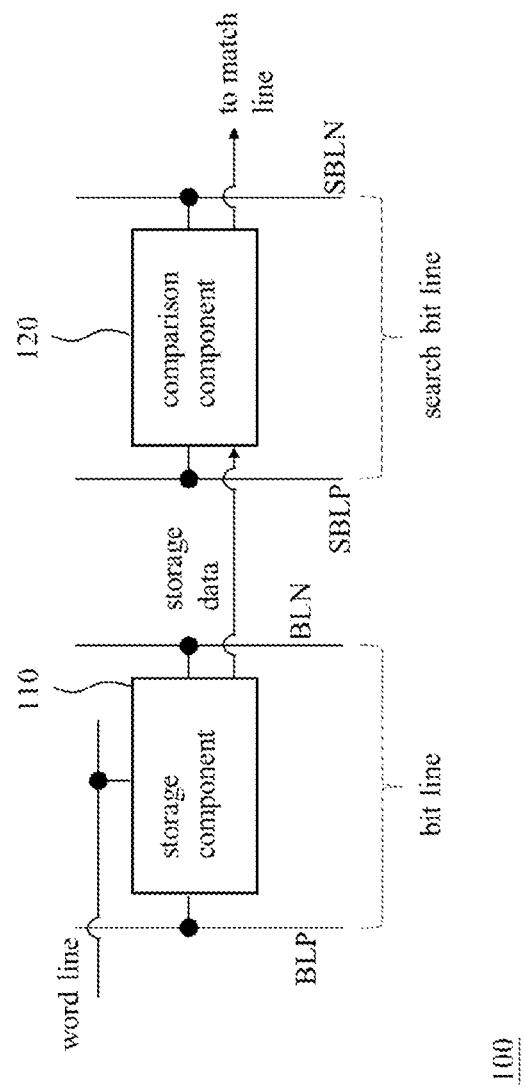
FIG. 1 shows a basic element of a conventional content addressable memory (CAM).
Figure 2:
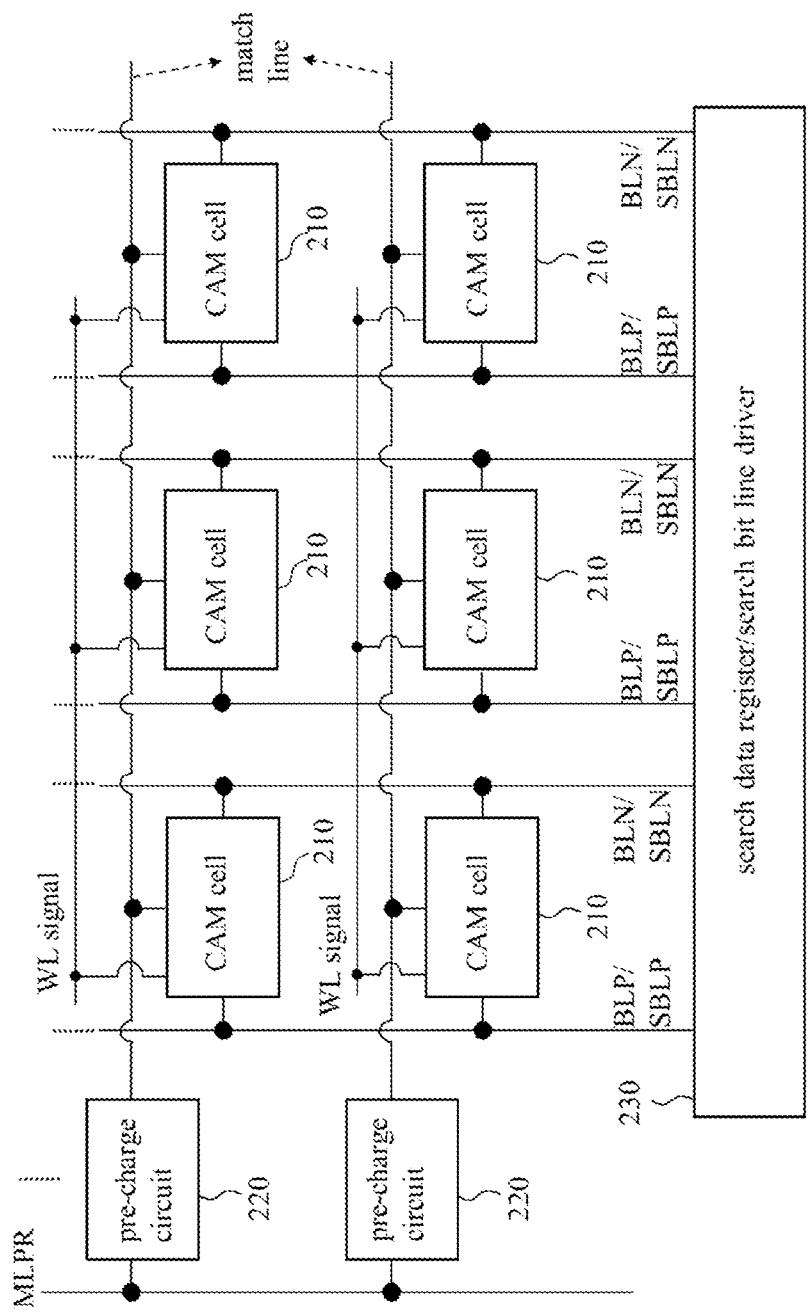
FIG. 2 shows a basic configuration of a conventional CAM array.

It is noted that each row of the CAM cells 210 of FIG. 2 can be integrated into a known hierarchical architecture. This hierarchical architecture shares a global match line, and the pre-charge circuit 300/500 which can take the place of the pre-charge circuit 220 of FIG. 2 can optionally mask the variation of the match line pre-charge signal MLPR as mentioned in the preceding paragraphs and thereby control the signal level of the global match line. In brief, the pre-charge circuit 300/500 of FIG. 3/5 is applicable to multiple kinds of CAMs, especially to CAMs having different kinds of NOR type match line architectures.

It is noted that people of ordinary skill in the art can selectively use some or all of the features of any embodiment in this specification or selectively use some or all of the features of multiple embodiments in this specification to implement the present invention as long as such implementation is practicable; in other words, the present invention can be carried out flexibly in accordance with the present disclosure.

To sum up, the masking circuit and pre-charge circuit of the present disclosure can determine whether to mask the comparison result of a basic element of a CAM, and this is helpful to reduce the circuit design complexity of the CAM and can reduce the design and manufacturing cost of the CAM.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A masking circuit of a content addressable memory (CAM), the masking circuit comprising:
    a masking control circuit configured to generate a masking signal according to a first signal and a second signal, wherein when both the first signal and the second signal are at a first level, the masking signal is a first masking signal, and when the first signal and the second signal are at different levels respectively, the masking signal is a second masking signal different from the first masking signal; and
    a level control circuit configured to generate a level control signal according to the masking signal and thereby determine whether to pull a voltage level of an output terminal to a predetermined level,
    wherein the output terminal is coupled to a match line of the CAM; when the masking signal is the first masking signal, the level control circuit pulls the voltage level of the output terminal to the predetermined level; and when the masking signal is the second masking signal, the level control circuit does not interfere in the voltage level of the output terminal,
    wherein the first signal is a word line signal for the CAM, and the second signal is a write enablement signal for the CAM.

2. The masking circuit of claim 1, wherein when the masking signal is the first masking signal, a match line pre-charge signal is at a second level; the match line pre-charge signal is for determining whether to charge the match line in advance; when the match line pre-charge signal is at the second level, the match line pre-charge signal determines not to charge the match line in advance; and when the match line pre-charge signal is at the first level, the match line pre-charge signal determines to charge the match line in advance.

3. The masking circuit of claim 2, wherein when the both the first signal and the second signal are at the second level, the masking signal is the second masking signal.

4. The masking circuit of claim 1, wherein the masking control circuit includes a NAND gate, and the NAND gate is configured to generate the masking signal according to the first signal and the second signal.

5. The masking circuit of claim 1, wherein the level control circuit includes:
    an inverter configured to generate the level control signal according to the masking signal; and
    a switch coupled between the output terminal and a predetermined-level terminal, and configured to couple the output terminal with the predetermined-level terminal or decouple the output terminal from the predetermined-level terminal according to the level control signal, wherein a voltage level of the predetermined-level terminal is the predetermined level.

6. The masking circuit of claim 1, wherein the predetermined level is equal to a grounding level.

7. A pre-charge circuit applicable to a content addressable memory (CAM), the pre-charge circuit comprising:
    a masking control circuit configured to generate a masking signal according to a word line (WL) signal and a write enablement (WE) signal, wherein when both the WL signal and the WE signal are at a first level, the masking signal is a first masking signal, and when the WL signal and the WE signal are at different levels respectively, the masking signal is a second masking signal different from the first masking signal;

a charge control circuit configured to generate a charge control signal according to a match line pre-charge signal and the masking signal and thereby determine whether to charge a match line, wherein when the masking signal is the first masking signal, the masking signal masks a variation of the match line pre-charge signal to allow the charge control signal to be free from the variation of the match line pre-charge signal, and when the masking signal is the second masking signal, the masking signal does not mask the variation of the match line pre-charge signal to let the charge control signal vary with the variation of the match line pre-charge signal; and a discharge control circuit configured to generate a discharge control signal according to the masking signal and thereby determine whether to discharge charges of the match line, wherein when the masking signal masks the variation of the match line pre-charge signal, the discharge control signal is used for discharging the charges of the match line.

8. The pre-charge circuit of claim 7, wherein when both the WL signal and the WE signal are at a second level different from the first level, the masking signal is the second masking signal.

9. The pre-charge circuit of claim 7, wherein the masking control circuit includes a first NAND gate, and the first NAND gate is configured to generate the masking signal according to the WL signal and the WE signal.

10. The pre-charge circuit of claim 9, wherein the charge control circuit includes a second NAND gate, and the second NAND gate is configured to generate the charge control signal according to the match line pre-charge signal and the masking signal.

11. The pre-charge circuit of claim 10, wherein the charge control circuit further includes a first switch, and the first switch is configured to couple a charge terminal with the match line or decouple the charge terminal from the match line according to the charge control signal.

12. The pre-charge circuit of claim 9, wherein the discharge control circuit includes an inverter, and the inverter is configured to generate the discharge control signal according to the masking signal.

13. The pre-charge circuit of claim 12, wherein the discharge control signal further includes a second switch, and the second switch is configured to couple the match line with a discharge terminal or decouple the match line from the discharge terminal according to the discharge control signal.

14. A pre-charge circuit applicable to a content addressable memory (CAM), the pre-charge circuit comprising a masking control circuit, a charge control circuit, and a discharge control circuit, wherein:

the masking control circuit is configured to couple a charge terminal with the charge control circuit or decouple the charge terminal from the charge control circuit according to a word line (WL) signal and a write enablement (WE) signal, in which when any of the WL signal and the WE signal is at a first level, the masking control circuit couples the charge terminal with the charge control circuit, and when both the WL signal and the WE signal are not at the first level, the masking control circuit decouples the charge terminal from the charge control circuit;

the charge control circuit is configured to determine whether to charge a match line according to a match line pre-charge signal, wherein when the match line pre-charge signal is at a second level, the charge control circuit determines to charge the match line, and when the match line pre-charge signal is at the first level, the charge control circuit determines not to charge the match line; and the discharge control circuit is configured to determine whether to discharge charges of the match line according to the WL signal and the WE signal, wherein when both the WL signal and the WE signal are at the second level, the discharge control circuit determines to discharge the charges of the match line, and when any of the WL signal and the WE signal is not at the second level, the discharge control circuit determines not to discharge the charges of the match line.

15. The pre-charge circuit of claim 14, wherein the masking control circuit includes:

a first switch coupled between the charge terminal and the charge control circuit, and configured to couple the charge terminal with the charge control circuit or decouple the charge terminal from the charge control circuit according to the WE signal; and a second switch coupled between the charge terminal and the charge control circuit, and configured to couple the charge terminal with the charge control circuit or decouple the charge terminal from the charge control circuit according to the WL signal.

16. The pre-charge circuit of claim 15, wherein the charge control circuit includes:

an inverter configured to generate an inverted match line pre-charged signal according to the match lie pre-charge signal and thereby determine whether to charge the match line; and a third switch configured couple the masking control circuit with the match line or decouple the masking control circuit from the match line according to the inverted match line pre-charge signal.

17. The pre-charge circuit of claim 16, wherein the discharge control circuit includes:

a fourth switch couple between the match line and a fifth switch, and configured to couple the match line with the fifth switch or decouple the match line from the fifth switch according to a first signal being one of the WL signal and the WE signal; and the fifth switch coupled between the fourth switch and a discharge terminal, and configured to couple the fourth switch with the discharge terminal or decouple the fourth switch from the discharge terminal according to a second signal which is one of the WL signal and the WE signal and is different from the first signal.

* * * * *